(12) United States Patent
Chung et al.

(10) Patent No.: US 12,300,509 B2
(45) Date of Patent: May 13, 2025

(54) METHOD OF MANUFACTURING SEMICONDUCTOR PACKAGE

(71) Applicant: SAMSUNG ELECTRONICS CO., LTD., Suwon-si (KR)

(72) Inventors: Junyong Chung, Sejong-si (KR); Wooseup Hwang, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 17/834,092

(22) Filed: Jun. 7, 2022

(65) Prior Publication Data

US 2023/0114633 A1    Apr. 13, 2023

(30) Foreign Application Priority Data

Oct. 12, 2021   (KR) ...................... 10-2021-0135303

(51) Int. Cl.
*H01L 21/3213*     (2006.01)
*C09K 13/06*       (2006.01)
(Continued)

(52) U.S. Cl.
CPC ........ *H01L 21/32134* (2013.01); *C09K 13/06* (2013.01); *H01L 21/31111* (2013.01); *H01L 21/4857* (2013.01); *H01L 21/486* (2013.01); *H01L 23/49816* (2013.01); *H01L 23/49822* (2013.01); *H01L 23/49838* (2013.01); *H01L 23/49894* (2013.01); *H01L 24/08* (2013.01);
(Continued)

(58) Field of Classification Search
None
See application file for complete search history.

(56) References Cited

U.S. PATENT DOCUMENTS

| | | | | |
|---|---|---|---|---|
| 4,540,465 A | * | 9/1985 | Coggins | ................... C23F 1/08 252/79.3 |
| 5,756,237 A | * | 5/1998 | Amemiya | ................. G03F 1/20 430/323 |

(Continued)

FOREIGN PATENT DOCUMENTS

| | | |
|---|---|---|
| JP | 6369989 B2 | 8/2018 |
| JP | 6793312 B2 | 12/2020 |

(Continued)

*Primary Examiner* — Allan W. Olsen
(74) *Attorney, Agent, or Firm* — Muir Patent Law, PLLC

(57) ABSTRACT

A method of manufacturing a semiconductor package, the method including providing a first seed layer on an insulation layer such that the first seed layer includes a first metal material; providing a second seed layer on the first seed layer such that the second seed layer includes a second metal material different from the first metal material; forming photoresist patterns on the second seed layer; forming conductive patterns between the photoresist patterns, including the second metal material, and having line shapes that extend in a first direction; removing the photoresist patterns; etching the second seed layer to form second seed patterns having line shapes extending in the first direction; and etching the first seed layer to form first seed patterns having line shapes extending in the first direction, wherein an etchant includes deionized water, a fluorine compound, a competing compound, and a corrosion inhibitor.

20 Claims, 12 Drawing Sheets

(51) Int. Cl.
  *H01L 21/311*  (2006.01)
  *H01L 21/48*  (2006.01)
  *H01L 23/00*  (2006.01)
  *H01L 23/498*  (2006.01)
  *H01L 25/10*  (2006.01)

(52) U.S. Cl.
  CPC ............. *H01L 24/16* (2013.01); *H01L 24/32* (2013.01); *H01L 24/73* (2013.01); *H01L 25/105* (2013.01); *H01L 2224/08237* (2013.01); *H01L 2224/16227* (2013.01); *H01L 2224/16238* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01)

(56) References Cited

U.S. PATENT DOCUMENTS

| | | | | |
|---|---|---|---|---|
| 5,795,702 | A * | 8/1998 | Tanabe | G03F 7/425 510/176 |
| 8,894,876 | B2 | 11/2014 | Lee et al. | |
| 9,972,777 | B1 * | 5/2018 | Haq | H10N 50/01 |
| RE48,422 | E * | 2/2021 | Jung | H01L 24/03 |
| 2009/0203566 | A1 * | 8/2009 | Lee | G03F 7/425 510/175 |
| 2010/0248430 | A1 * | 9/2010 | Chang | H01L 23/66 257/E21.511 |
| 2011/0165776 | A1 * | 7/2011 | Hsu | H01L 23/481 257/E21.597 |
| 2011/0306534 | A1 * | 12/2011 | Hsu | H01L 21/02068 510/176 |
| 2014/0124922 | A1 * | 5/2014 | Kim | H01L 24/11 257/737 |
| 2015/0348925 | A1 * | 12/2015 | Surdock | H01L 24/13 257/737 |
| 2019/0081001 | A1 * | 3/2019 | Malik | H01L 21/02282 |
| 2022/0098487 | A1 * | 3/2022 | Gao | H01L 21/32134 |
| 2023/0238251 | A1 * | 7/2023 | Naito | C23F 1/26 252/79.1 |

FOREIGN PATENT DOCUMENTS

| | | |
|---|---|---|
| KR | 10-1728441 B1 | 4/2017 |
| KR | 10-1934299 B1 | 1/2019 |
| KR | 10-2021-0039179 A | 4/2021 |

\* cited by examiner

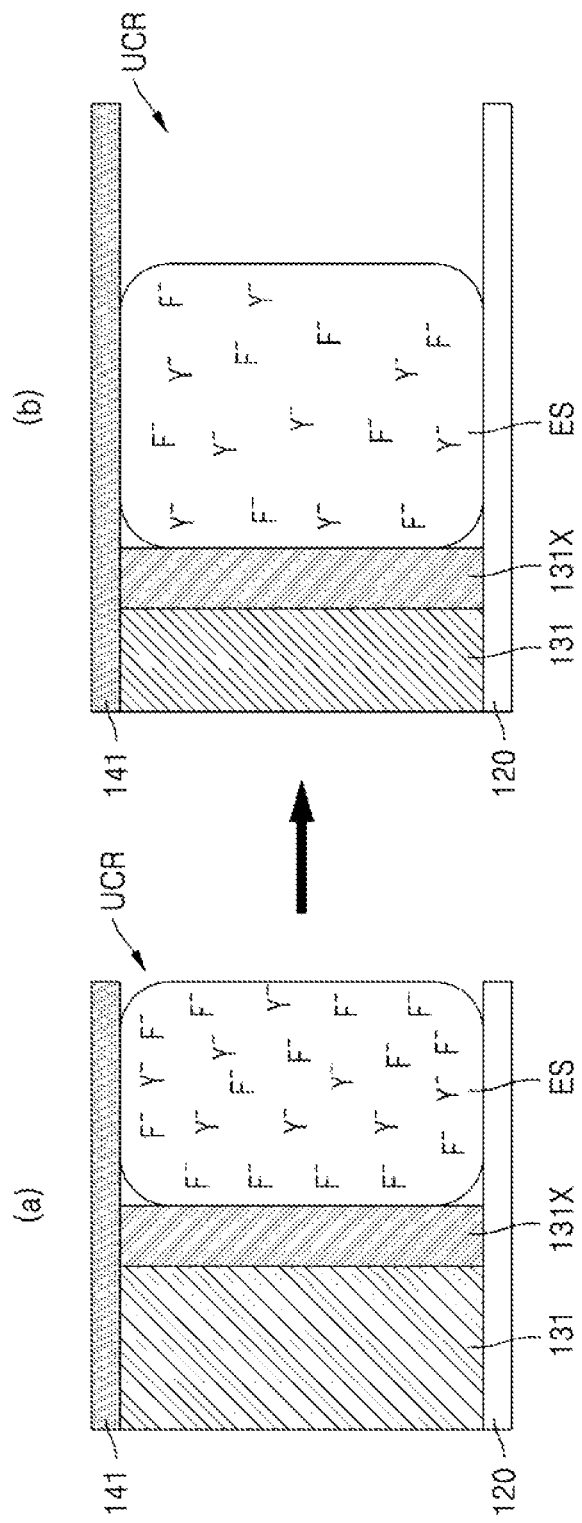

METHOD OF MANUFACTURING SEMICONDUCTOR PACKAGE

CROSS-REFERENCE TO RELATED APPLICATION

This application is based on and claims priority under 35 U.S.C. § 119 to Korean Patent Application No. 10-2021-0135303, filed on Oct. 12, 2021, in the Korean Intellectual Property Office, the disclosure of which is incorporated by reference herein in its entirety.

BACKGROUND

1. Field

Embodiments relate to a method of manufacturing a semiconductor package.

2. Description of the Related Art

Recently, due to a rapid increase in demand for electronic products, miniaturization and lighter weight of electronic components mounted on the electronic products has been considered. Accordingly, sizes of semiconductor packages mounted on the electronic components have been gradually decreasing. At the same time, logic chips, memory chips, or the like included in the semiconductor packages may process a large amount of data.

Accordingly, line widths and space widths of line and space patterns of redistribution layers included in the semiconductor packages have been miniaturized.

SUMMARY

The embodiments may be realized by providing a method of manufacturing a semiconductor package, the method including providing a first seed layer on an insulation layer such that the first seed layer includes a first metal material; providing a second seed layer on the first seed layer such that the second seed layer includes a second metal material that is different from the first metal material; forming photoresist patterns on the second seed layer; forming conductive patterns that fill spaces between the photoresist patterns, and including the second metal material, such that the conductive patterns have line shapes that extend in a first direction and are spaced apart from each other in a second direction orthogonal to the first direction; removing the photoresist patterns; etching the second seed layer to form second seed patterns such that the second seed patterns have line shapes extending in the first direction and are spaced apart from each other in the second direction; and etching the first seed layer to form first seed patterns such that the first seed patterns have line shapes extending in the first direction and are spaced apart from each other in the second direction, wherein etching the first seed layer includes etching with an etchant that includes deionized water, a fluorine compound, a competing compound, and a corrosion inhibitor.

The embodiments may be realized by providing a method of manufacturing a semiconductor package, the method including providing a first seed layer on an insulation layer such that the first seed layer includes a first metal material; forming second seed patterns and conductive patterns on the first seed layer such that the second seed patterns include a second metal material that is different from the first metal material, the conductive patterns include the second metal material, and the second seed patterns and the conductive patterns each have line shapes that extend in a first direction and are spaced apart from each other in a second direction orthogonal to the first direction; and etching the first seed layer to form first seed patterns such that the first seed patterns have line shapes extending in the first direction and are spaced apart from each other in the second direction, wherein etching the first seed layer includes etching with an etchant that includes fluorine ions and negative ions that undergo a negative ion competing reaction against the fluorine ions, and an etching rate of the first seed layer by the etchant is in a range of 200 Å/min to 2,000 Å/min.

The embodiments may be realized by providing a method of manufacturing a semiconductor package, the method including forming a first seed layer including titanium; forming second seed patterns and conductive patterns on the first seed layer such that the second seed patterns and the conductive patterns each include copper and the second seed patterns and the conductive patterns each have line shapes that extend in a first direction and are apart from each other in a second direction orthogonal to the first direction; and etching the first seed layer to form first seed patterns such that the first seed patterns have line shapes extending in the first direction and are spaced apart from each other in the second direction, wherein etching the first seed layer includes etching with an etchant that includes fluorine ions and negative ions undergoing a negative ion competing reaction against the fluorine ions, and an application time of the etchant is in a range of 1 to 10 times a time value obtained by dividing a thickness of the first seed layer by an etching rate of the etchant on the first seed layer.

The embodiments may be realized by providing a method of manufacturing a semiconductor package, the method including forming an insulation layer including a photosensitive material; forming a first seed layer on the insulation layer such that the first seed layer includes titanium and has a uniform thickness in a range of 50 nm to 150 nm; forming second seed patterns and conductive patterns on the first seed layer such that the second seed patterns and the conductive patterns each include copper, and the second seed patterns and the conductive patterns each have line shapes extending in a first direction and are spaced apart from each other in a second direction orthogonal to the first direction; and etching the first seed layer with an etchant to form first seed patterns such that the first seed patterns have line shapes that extend in the first direction and are apart from each other in the second direction, wherein the etchant includes a fluorine compound providing fluorine ions, and a competing compound providing negative ions that undergo a negative ion competing reaction against the fluorine ions, and a concentration of the fluorine ions in the etchant is greater than a concentration of the negative ions in the etchant.

BRIEF DESCRIPTION OF THE DRAWINGS

Features will be apparent to those of skill in the art by describing in detail exemplary embodiments with reference to the attached drawings in which:

FIG. 8 is a diagram of an effect of a method of manufacturing a semiconductor package, according to an example embodiment;

DETAILED DESCRIPTION

Figure 1:
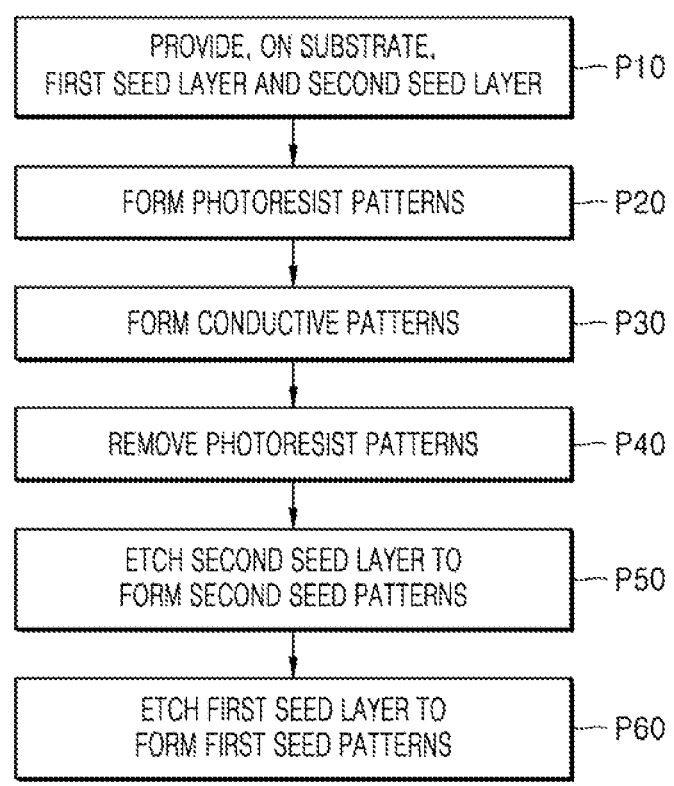
FIG. 1 is a flowchart of a method of manufacturing a semiconductor package, according to an example embodiment.

FIG. 1 is a flowchart of a method of manufacturing a semiconductor package, according to an example embodiment.

FIGS. 2A through 7C are stages in a method of manufacturing a semiconductor package, according to example embodiments.

Figure 2A:
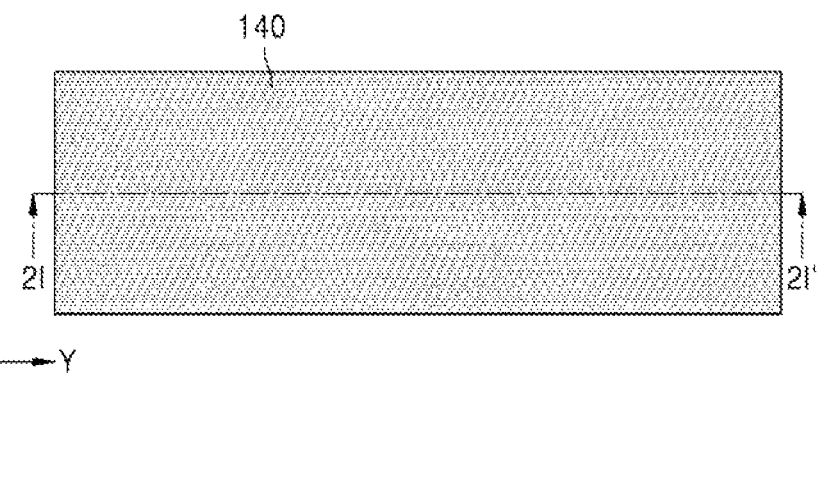
FIGS. 2A through 7C are stages in a method of manufacturing a semiconductor package, according to example embodiments.
Figure 2B:
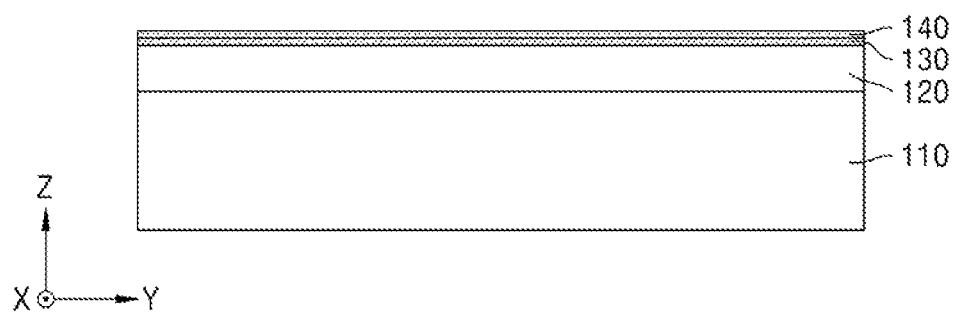
Figure 3A:
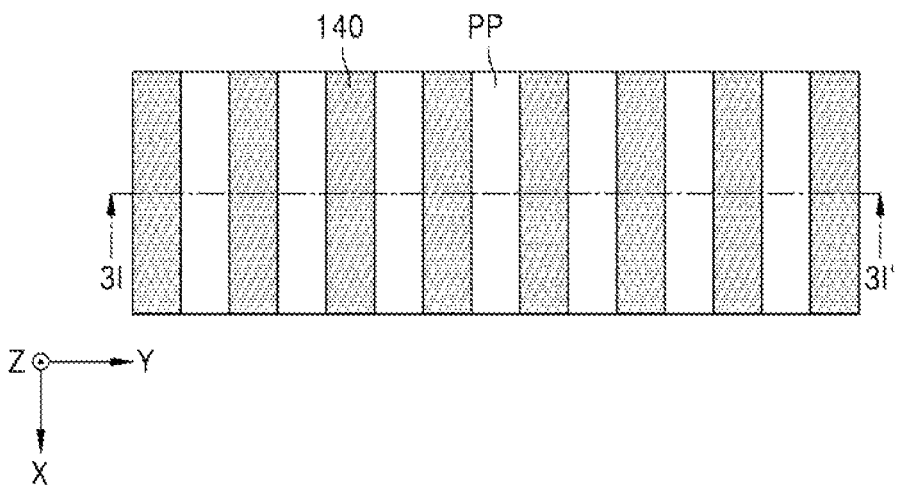
Figure 3B:
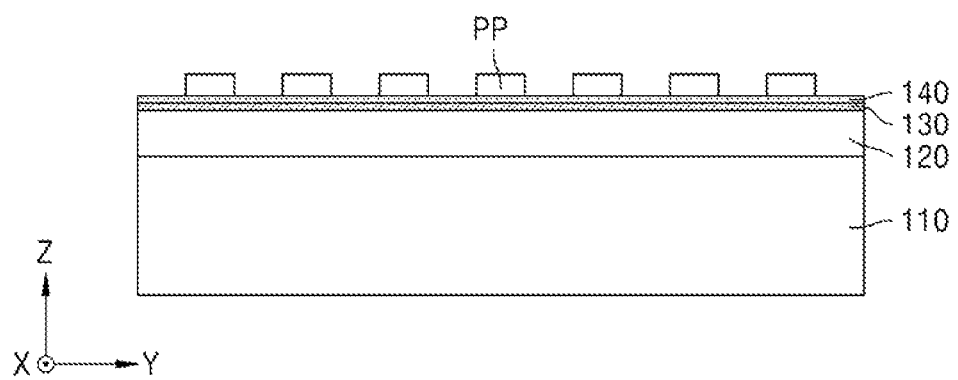
Figure 4A:
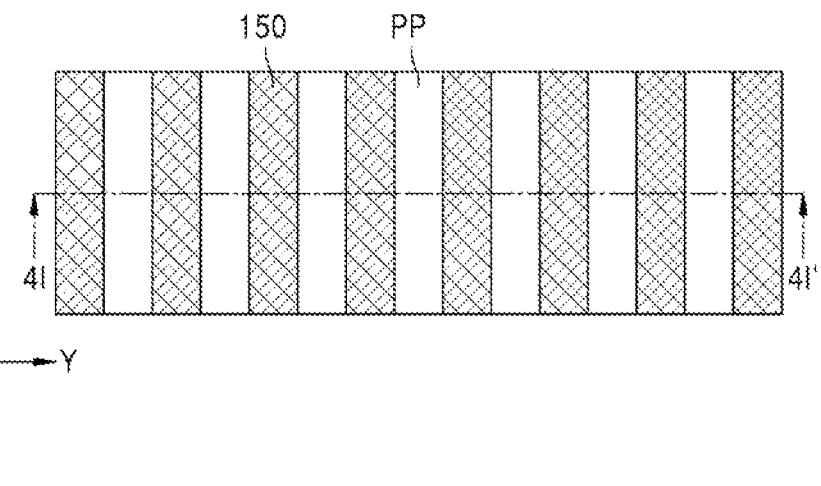
Figure 4B:
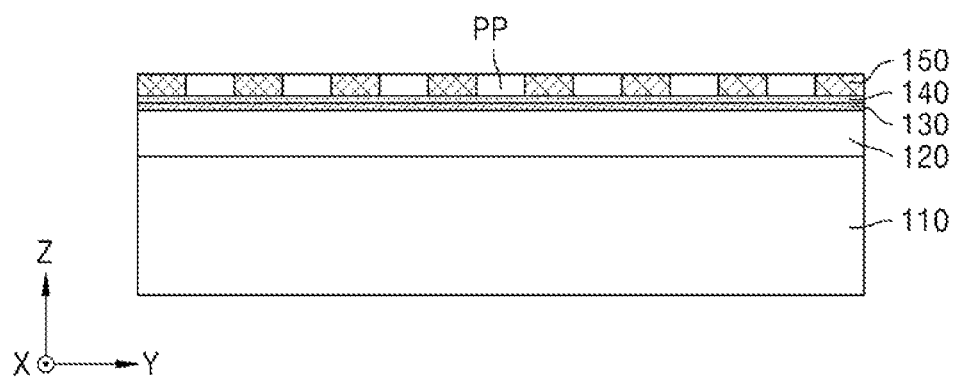
Figure 5A:
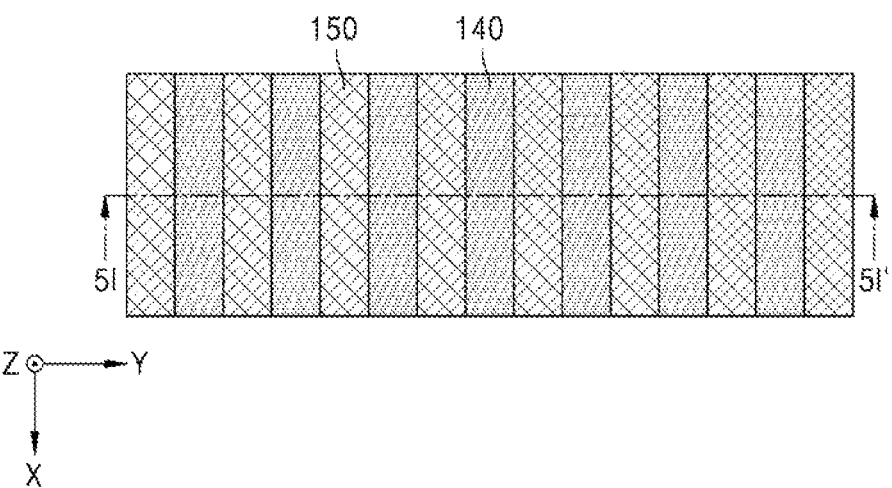
Figure 5B:
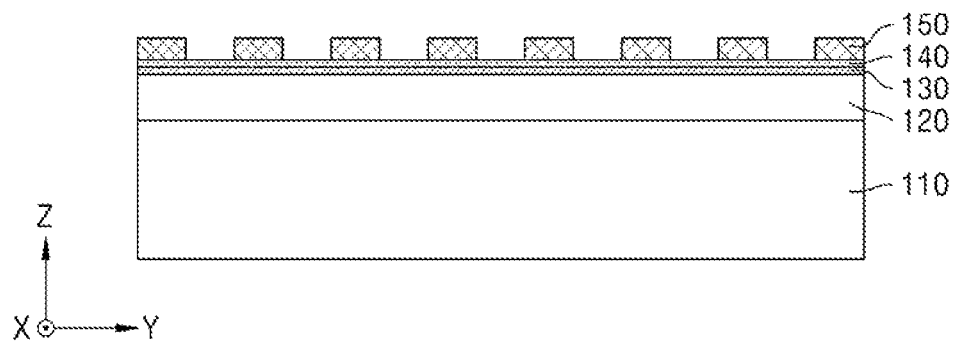
Figure 6A:
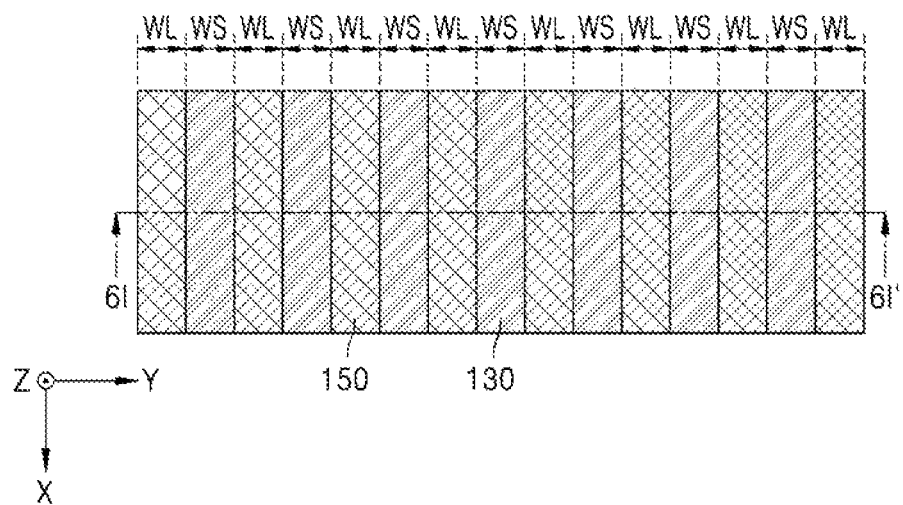
Figure 6B:
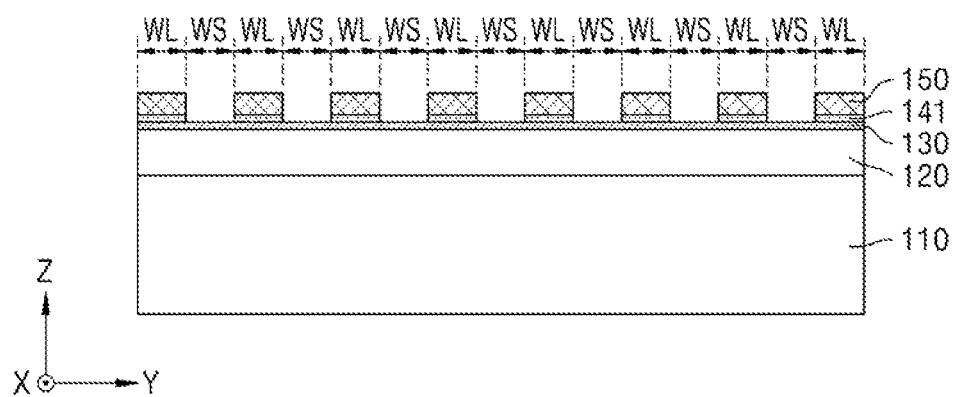
Figure 7A:
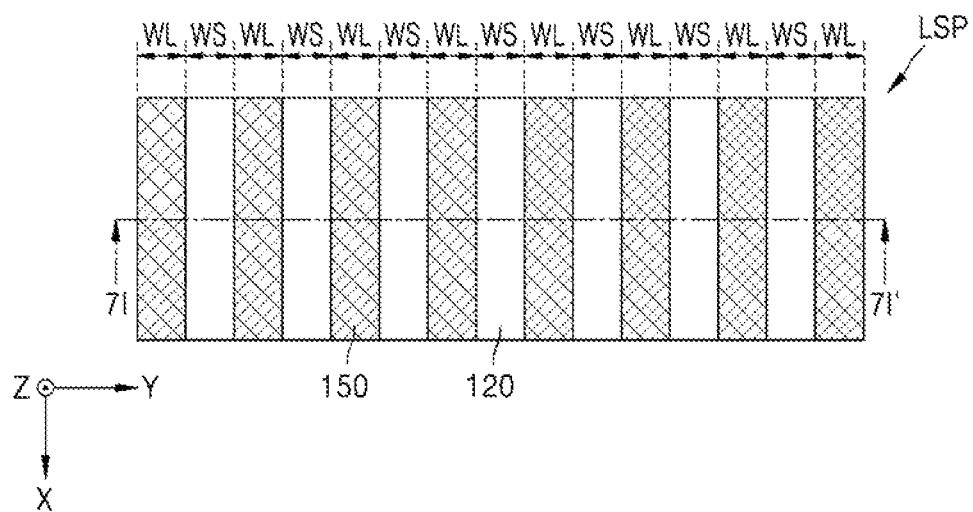
Figure 7B:
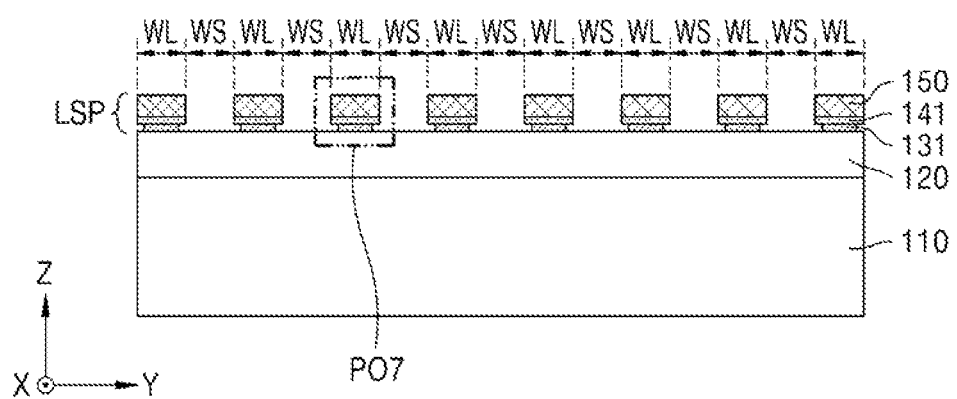
Figure 7C:
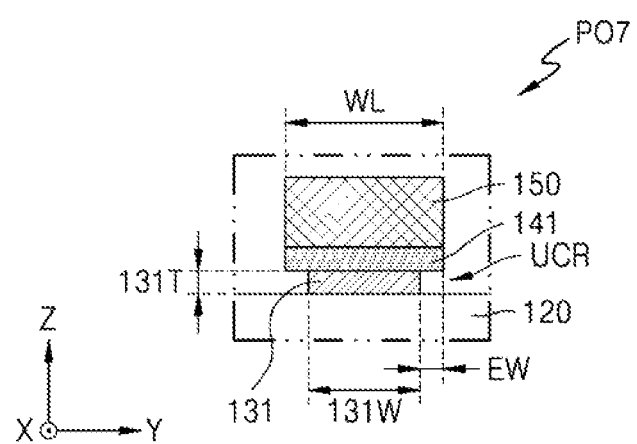

FIGS. 2A, 3A, 4A, 5A, 6A, and 7A are plan views of workpieces, which are results of respective processes, FIG. 2B is a cross-sectional view taken along line 2I-2I' in FIG. 2A, FIG. 3B is a cross-sectional view taken along line 3I-3I' in FIG. 3A, FIG. 4B is a cross-sectional view taken along line 4I-4I' in FIG. 4A, FIG. 5B is a cross-sectional view taken along line 5I-5I' in FIG. 5A, FIG. 6B is a cross-sectional view taken along line 6I-6I' in FIG. 6A, and FIG. 7B is a cross-sectional view taken along line 7I-7I' in FIG. 7A. FIG. 7C is a partial cross-sectional view of portion PO7 in FIG. 7B.

Referring to FIGS. 1, 2A, and 2B, an insulation layer 120, a first seed layer 130, and a second seed layer 140 may be provided on a substrate 110 (P10).

The substrate 110 may include, e.g., a semiconductor material such as silicon (Si). The substrate 110 may also include a semiconductor element such as germanium (Ge), and a chemical semiconductor such as silicon carbide (SiC), gallium arsenide (GaAs), indium arsenide (InAs), or indium phosphide (InP). As used herein, the term "or" is not an exclusive term, e.g., "A or B" would include A, B, or A and B.

Two directions, which are in parallel with an upper surface of the substrate 110 and perpendicular or orthogonal to each other, may be defined as an X (e.g., first) direction and a Y (e.g., second) direction, and a direction vertical to the upper surface of the substrate 110 may be defined as a Z (e.g., third) direction. Unless otherwise stated, the above definitions for directions may be equally applicable in the drawings below.

The insulation layer 120 may be provided on the substrate 110. The insulation layer 120 may include an insulation material. The insulation layer 120 may include, e.g., an organic compound. The insulation layer 120 may include an organic polymer material. The insulation layer 120 may include, e.g., a photo imageable dielectric (PID) material, an Ajinomoto build-up film (ABF), photosensitive polyimide (PSPI), or the like. In an implementation, the insulation layer 120 may also include silicon oxide or silicon nitride. When the insulation layer 120 includes the PID material or PSPI, the insulation layer 120 may be patterned without forming a separate photoresist layer.

The first seed layer 130 may be provided on the insulation layer 120. In an implementation, the first seed layer 130 may be formed by a sputtering process. In an implementation, the first seed layer 130 may be provided by physical vapor deposition, atomic layer deposition, or the like. In an implementation, the first seed layer 130 may have a uniform thickness (e.g., in the Z direction). In an implementation, a thickness of the first seed layer 130 may be in a range of 50 nm to 150 nm. In an implementation, the thickness of the first seed layer 130 may be about 100 nm.

In an implementation, the first seed layer 130 may include a metal material. In an implementation, the first seed layer 130 may include, e.g., titanium (Ti). In an implementation, the first seed layer 130 may include, e.g., titanium tungsten (TiW), titanium nitride (TiN), tantalum (Ta), tantalum nitride TaN, chromium (Cr), or aluminum (Al).

The second seed layer 140 may be provided on the first seed layer 130. In an implementation, the second seed layer 140 may be formed by a sputtering process. In an implementation, the second seed layer 140 may be formed by physical vapor deposition or atomic layer deposition. The second seed layer 140 may have a uniform thickness. A thickness of the second seed layer 140 may have a range of about 150 nm to about 200 nm.

The second seed layer 140 may include a different metal material from the first seed layer 130. In an implementation, the second seed layer 140 may include, e.g., copper (Cu). In an implementation, the second seed layer 140 may include, e.g., Al, tungsten (W), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof.

Next, referring to FIGS. 1, 3A, and 3B, photoresist patterns PP may be formed (P20). The photoresist patterns PP may be formed on the second seed layer 140.

The forming of the photoresist patterns PP may include a spin coating process of providing a photoresist layer, an exposure process of transferring a set circuit layout on the photoresist layer, and a development process of removing an exposed portion (or an unexposed portion) of the photoresist. The forming of the photoresist patterns PP may further include a soft bake process, a post exposure bake (PEB) process for increasing contrast of a latent image, a hard bake process, or the like.

The photoresist patterns PP may include patterns for forming a line and space pattern. In an implementation, the photoresist patterns PP may include the line and space pattern. In an implementation, the photoresist patterns PP may further include a pattern having a pad shape.

Next, referring to FIGS. 1, 4A, and 4B, conductive patterns 150 may be formed (P30). The conductive patterns 150 may be formed on the second seed layer 140.

In an implementation, after a conductive material layer is formed by using an epitaxial growth process or an electrolytic plating process, or the like, and by removing an upper portion of the conductive material layer, the conductive patterns 150 may be formed. The conductive material layer may be sufficiently provided to fill spaces between the photoresist patterns PP. The upper portion of the conductive material layer may be removed by using a metal chemical mechanical polishing (CMP) process or a wet etching process. In an implementation, the metal CMP process may be terminated based on a set process time. In an implementation, upper surfaces of the photoresist patterns PP may include terminal points of the metal CMP process.

In an implementation, the conductive patterns 150 may include the same material as the second seed layer 140. In an implementation, when the second seed layer 140 includes Cu, the conductive patterns 150 may also include Cu. In an implementation, the conductive patterns 150 may constitute a continuous single layer by being integrated to the second seed layer 140. In an implementation, no boundary may be formed between the conductive patterns 150 and the second seed layer 140.

Next, referring to FIGS. 1, 5A, and 5B, the photoresist patterns PP may be removed (P40). The photoresist patterns PP may be removed by using a strip process. The photoresist patterns PP may be removed by using a water-based peeling liquid including, e.g., potassium hydroxide (KOH) and monoethanolamine (MEA).

Next, referring to FIGS. 1, and 5A through 6B, the second seed layer 140 may be etched to form second seed patterns 141 (P50). The second seed layer 140 may be etched by using a wet etching process. In an implementation, the second seed layer 140 may be etched using an etchant including, e.g., sulfuric acid and hydrogen peroxide.

When the second seed patterns 141 are formed, some of the conductive patterns 150 may be etched as well. Each of the conductive patterns 150 and the second seed patterns 141 may include a line pattern, which has a line width WL in the Y direction and extends (e.g., lengthwise) in the X direction. In an implementation, the conductive patterns 150 and the second seed patterns 141 may further include patterns having a pad shape. Spaces between adjacent conductive patterns 150 and spaces between adjacent second seed patterns 141 may be the same as each other, as a space width WS.

In an implementation, the line width WL and the space width WS may be substantially the same as each other. In an implementation, each of the line width WL and the space width WS may be equal to or less than about 2 μm. In an implementation, each of the line width WL and the space width WS may be greater than about 2 μm. Each of the line width WL and the space width WS may be, e.g., about 15 μm.

Next, referring to FIGS. 1, and 6A through 7C, the first seed layer 130 may be etched to form first seed patterns 131 (P60). The first seed patterns 131 may have line patterns, which extend in the X direction and are apart from each other in the Y direction. In an implementation, the first seed patterns 131, the second seed patterns 141, and the conductive patterns 150 may constitute line and space patterns LSP having the line width WL and spaced apart to have the space width WS to be electrically separated from each other.

The first seed patterns 131 and the second seed layer 140 may be etched by a wet etching process. In an implementation, an etchant for etching the first seed patterns 131 may include, e.g., deionized water, an acid, a fluorine compound, a competing compound, and a corrosion inhibitor. The etchant may be provided by dissolving an acid, a fluorine compound, a competing compound, and a corrosion inhibitor in the deionized water.

The hydrogen ion concentration (pH) of the etchant may be in a range of 1.0 to 6.0. The pH of the etchant may be equal to or greater than about 1.5. The pH of the etchant may be equal to or greater than about 2.5. The pH of the etchant may be equal to or greater than about 3.5. The pH of the etchant may be equal to or greater than about 4.5. The pH of the etchant may be equal to or less than about 5.5.

In an implementation, the acid of the etchant may include an organic acid or an inorganic acid. The organic acid of the etchant may include, e.g., citric acid. In an implementation, the inorganic acid of the etchant may include, e.g., nitric acid ($HNO_3$).

In an implementation, when the inorganic acid includes a nitric acid, a weight ratio (e.g., amount) of the inorganic acid included in the etchant may be in a range of 0.1 wt % to 10 wt % (e.g., based on a total weight of the etchant).

In an implementation, the acid may be omitted. In an implementation, the etchant may include, e.g., deionized water, a fluoride compound, a competing compound, and a corrosion inhibitor.

In an implementation, the fluorine compound of the etchant may include, e.g., ammonium fluoride ($NH_4F$). In an implementation, the fluorine compound of the etchant may include, e.g., $NF_4BF_4$, $N(Bu)_4F$, $N(Bu)_4BF_4$, $NH_4HF_2$, $NH_4PF_6$, $N(Bu)_4PF_6$, or the like. In an implementation, the fluorine compound of the etchant may include, e.g., HF, $CF_3COOH$, anhydrous hydrogen fluoride, or the like.

In an implementation, when the fluorine compound includes ammonium fluoride ($NH_4F$), an amount of the fluorine compound included in the etchant may be in a range of 0.5 wt % to 5 wt %. In an implementation, when the fluorine compound includes $NH_4F$, an amount of the fluorine compound included in the etchant may be equal to or greater than about 1.0 wt %. In an implementation, when the fluorine compound includes $NH_4F$, an amount of the fluorine compound included in the etchant may be equal to or greater than about 1.5 wt %. In an implementation, when the fluorine compound includes $NH_4F$, an amount of the fluorine compound included in the etchant may be equal to or greater than about 2.0 wt %. In an implementation, when the fluorine compound includes $NH_4F$, an amount of the fluorine compound included in the etchant may be equal to or greater than about 2.5 wt %. In an implementation, when the fluorine compound includes $NH_4F$, an amount of the fluorine compound included in the etchant may be equal to or less than about 4.5 wt %. In an implementation, when the fluorine compound includes $NH_4F$, an amount of the fluorine compound included in the etchant may be equal to or less than about 4.0 wt %. In an implementation, when the fluorine compound includes $NH_4F$, an amount of the fluorine compound included in the etchant may be equal to or less than about 3.5 wt %. In an implementation, when the fluorine compound includes $NH_4F$, an amount of the fluorine compound included in the etchant may be equal to or less than about 3.0 wt %.

When the fluorine compound includes $NH_4F$, and if an amount of the fluorine compound in the etchant were to be less than about 0.5 wt %, an etching rate of the first seed layer 130, or an etching object layer, could be extremely low. If an amount of the fluorine compound in the etchant were to exceed about 5 wt %, an etching rate of the first seed layer 130, or an etching object layer, could be extremely fast and accordingly, controllability on a process could be deteriorated.

In an implementation, suitable amounts of each fluorine compound, e.g., $NF_4BF_4$, $N(Bu)_4F$, $N(Bu)_4BF_4$, $NH_4HF_2$, $NH_4PF_6$, HF, $CF_3COOH$, anhydrous hydrogen fluoride, or the like, may be included in the etchant.

In an implementation, the amount of the fluorine compound of the etchant may be a suitable amount selected with a view toward allowing an etching rate of the first seed layer 130 by using the etchant to be in a range of 200 Å/min to 2,000 Å/min.

In an implementation, the competing compound of the etchant may provide a negative ion $Y^-$. In an implementation, the competing compound of the etchant may include the negative ion $Y^-$, which is capable of a negative ion competing reaction against fluorine ion F. In an implementation, the competing compound of the etchant may provide, to the etchant, the negative ion $Y^-$ having or undergoing a similar reaction to the fluorine ion $F^-$ against a material (e.g., Ti) of the first seed layer 130. In an implementation, the negative ion competing reaction may use Le Chatelier's principle, in which a reaction of generating a high concentration in the etchant is inhibited.

In an implementation, the competing compound of the etchant may include, e.g., a halogen-containing group. In an implementation, the competing compound may include halogenide (e.g., a halide). The competing compound of the etchant may include, e.g., CaF, NaCl, AgBr, KI, or the like.

In an implementation, the competing compound of the etchant may provide a negative ion of the halogen group to the etchant.

In an implementation, in the etchant, a molarity (e.g., concentration) of negative ions $Y^-$ provided by the competing compound in the etchant may be less than a molarity of fluorine ions $F^-$ provided by the fluorine compound in the etchant. In an implementation, an amount (e.g., by weight) of the competing compound in the etchant may be less than an amount of the fluorine compound in the etchant.

In an implementation, in the etchant, a difference between an amount of the competing compound and an amount of the fluorine compound may be in a range of 0.1 wt % to 1 wt %. In an implementation, in the etchant, the difference between the amount of the competing compound and the amount of the fluorine compound may be equal to or greater than about 0.2 wt %. In an implementation, in the etchant, the difference between the amount of the competing compound and the amount of the fluorine compound may be equal to or greater than about 0.3 wt %. In an implementation, in the etchant, the difference between the amount of the competing compound and the amount of the fluorine compound may be equal to or greater than about 0.4 wt %. In an implementation, in the etchant, the difference between the amount of the competing compound and the amount of the fluorine compound may be equal to or less than about 0.9 wt %. In an implementation, in the etchant, the difference between the amount of the competing compound and the amount of the fluorine compound may be equal to or less than about 0.8 wt %. In an implementation, in the etchant, the difference between the amount of the competing compound and the amount of the fluorine compound may be equal to or less than about 0.7 wt %. In an implementation, in the etchant, the difference between the amount of the competing compound and the amount of the fluorine compound may be equal to or less than about 0.6 wt %. In an implementation, in the etchant, the difference between the amount of the competing compound and the amount of the fluorine compound may be about 0.5 wt %.

If the difference between the amount of the competing compound and the amount of the fluorine compound were to be extremely low in the etchant, an etching rate could be extremely low. If the difference between the amount of the competing compound and the amount of the fluorine compound were to be extremely high in the etchant, a competing reaction between the negative ion $Y^-$ and the fluorine compound $F^-$, and thus, an exclusion width EW of the first seed patterns 131, could become extremely large.

In an implementation, the amount of the competing compound included in the etchant may be in a range of 0.1 wt % to 4.5 wt %. In an implementation, the amount of the competing compound included in the etchant may be equal to or greater than about 0.5 wt %. In an implementation, the amount of the competing compound included in the etchant may be equal to or greater than about 1.0 wt %. In an implementation, the amount of the competing compound included in the etchant may be equal to or greater than about 1.5 wt %. In an implementation, the amount of the competing compound included in the etchant may be equal to or greater than about 2.0 wt %. In an implementation, the amount of the competing compound included in the etchant may be equal to or less than about 4.0 wt %. In an implementation, the amount of the competing compound included in the etchant may be equal to or less than about 3.5 wt %. In an implementation, the amount of the competing compound included in the etchant may be equal to or less than about 3.0 wt %.

In an implementation, the corrosion inhibitor of the etchant may help prevent damage to the second seed patterns 141 and the conductive patterns 150. The corrosion inhibitor of the etchant may include, e.g., an azole compound (e.g., thiazole, benzotriazole, imidazole, thiadiazole, or the like), amine, a Schiff base, an amino acid drug compound, or the like. In an implementation, an amount of the corrosion inhibitor included in the etchant may be about 0.1 wt % to about 2 wt %.

In an implementation, if first seed patterns 131 were to not be sufficiently etched, a short circuit defect could occur between adjacent conductive patterns 150. An excessive etching may be performed on the first seed layer 130 for securing a process margin of the line and space patterns LSP, and both sidewalls of the first seed patterns 131 may be further etched by the exclusion width EW, compared to the second seed patterns 141, and may be recessed (e.g., relative to sidewalls of the second seed patterns 141). Accordingly, a width 131W (e.g., in the Y direction) of the first seed patterns 131 may be less than the line width WL (e.g., in the Y direction) of the second seed patterns 141 and the conductive patterns 150.

In an implementation, the exclusion width EW may be in a range of 0.1 to 2 times a thickness 131T (e.g., a height in the Z direction) of the first seed patterns 131. In an implementation, the exclusion width EW may be equal to or less than about 1.5 times the thickness 131T of the first seed patterns 131. In an implementation, the exclusion width EW may be equal to or less than about 1.0 times the thickness 131T of the first seed patterns 131. In an implementation, the exclusion width EW may be equal to or less than about 0.5 times the thickness 131T of the first seed patterns 131. In this case, a space formed by (e.g., laterally adjacent to) the first seed patterns 131, which are recessed compared to the second seed patterns 141, may be referred to as an undercut region UCR.

In this case, an excessive etching of the first seed layer 130 may mean that an application time of the etchant to the substrate 110 is sufficiently long. In an implementation, the excessive etching may mean that an etchant of the first seed layer 130 may be applied to the substrate 110 for a time longer than a time required for etching an initial thickness of the first seed layer 130 (e.g., for removing portions of the first seed layer 130 to expose the insulation layer 120 under the first seed layer 130).

In an implementation, etching of the first seed layer 130 may be performed longer than a time required by or for the etchant for etching the thickness of the first seed layer 130 (e.g., a time for the etchant to etch through the first seed layer 130 in a thickness direction thereof or the Z direction). In an implementation, the etching of the first seed layer 130 may be performed for a time range of about 1 to about 10 times a time required for etching the thickness of the first seed layer 130 by the etchant (e.g., a time value or time obtained by dividing the initial thickness of the first seed layer 130 by the etching rate of the etchant, using units that cancel out such that only a time unit remains). In an implementation, the etching of the first seed layer 130 may be performed for a time range of about 1 to about 3 times a time required for etching the thickness of the first seed layer 130 by the etchant (e.g., a time value obtained by dividing the initial thickness of the first seed layer 130 by the etching rate of the etchant).

In an implementation, the etching rate of the etchant on the first seed layer 130 may be equal to or greater than about 1,000 Å/min. In an implementation, the etchant may include the fluorine compound, and the etching rate of the etchant on the first seed layer 130 (which may include a first metal material such as Ti) may be faster than an etching rate of other etchants that include an acid and hydrogen peroxide.

In an implementation, when the thickness of the first seed layer 130 is about 100 nm before the etching on the first seed layer 130 is performed, an application time of the etchant may be in a range of 1/10 (e.g., 0.1 minutes or 6 seconds) to 1 minute.

In an implementation, by excessively etching the first seed patterns 131 by using an etchant, which may include deionized water, an organic acid, an inorganic acid, a fluorine compound, a competing compound, and a corrosion inhibitor, the exclusion width EW of the first seed patterns 131 may be prevented from becoming extremely large. Accordingly, even when the miniaturized line and space patterns LSP having the line width WL and the space width WS, each of which is equal to or less than 2 are formed, deterioration of electrical reliability of a semiconductor package due to damage to the line and space patterns LSP, which could otherwise be caused by an excessive exclusion width EW of the first seed patterns 131, may be prevented.

FIG. 8 is a diagram of an effect of a method of manufacturing a semiconductor package, according to an example embodiment.

Parts (a) and (b) of FIG. 8 illustrate forming of the undercut region UCR of the first seed patterns 131 over time. When the first seed patterns 131 includes Ti, an oxidation layer 131X, which is generated by a reaction of Ti with oxygen or water, may be formed on sidewalls of the first seed patterns 131. The oxidation layer 131X may include, e.g., titanium oxide such as $TiO_2$.

The titanium oxide may be etched according to an equation below.

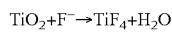

$$TiO_2 + F^- \rightarrow TiF_4 + H_2O$$

When a recessed depth of the first seed patterns 131 with respect to the second seed patterns 141 is small, an etching solution ES may be introduced into the undercut region UCR due to a capillary phenomenon. At an initial time point of introducing the etching solution ES, as illustrated in part (a) of FIG. 8, a concentration of fluorine ions $F^-$ may be sufficiently higher than concentration of the negative ion $Y^-$. Accordingly, an etching reaction of the oxidation layer 131X may occur according to the above chemical formula. In an implementation, when a depth of the undercut region UCR is small, the oxidation layer 131X of the first seed patterns 131 may be etched by the etching solution ES introduced by the capillary phenomenon.

However, as the recessed depth of the first seed patterns 131 with respect to the second seed patterns 141 becomes larger, e.g., due to the etching on the first seed patterns 131, mass transfer of the etchant solution ES may be limited because the thickness 131T of the first seed patterns 131 is small, and accordingly, as illustrated in part (b) of FIG. 8, the concentration of fluorine ions $F^-$ may decrease as the etching reaction proceeds. In an implementation, when the depth of the undercut region UCR is large, an additional etchant may not be introduced into the undercut region UCR, and the concentration of fluorine ions $F^-$ may decrease over time.

When the concentration of fluorine ions $F^-$ decreases, the etching rate on the sidewalls of the first seed patterns 131 may decrease due to a negative ion competing reaction between the negative ion $Y^-$ and the fluorine ion F. Accordingly, the exclusion width EW of the first seed patterns 131 may be maintained sufficiently small despite the excessive etching of the first seed layer 130, damage to the line and space patterns LSP due to the excessive etching of the first seed patterns 131 may be prevented, and reliability of manufacturing a semiconductor package may be enhanced.

Figure 9A:
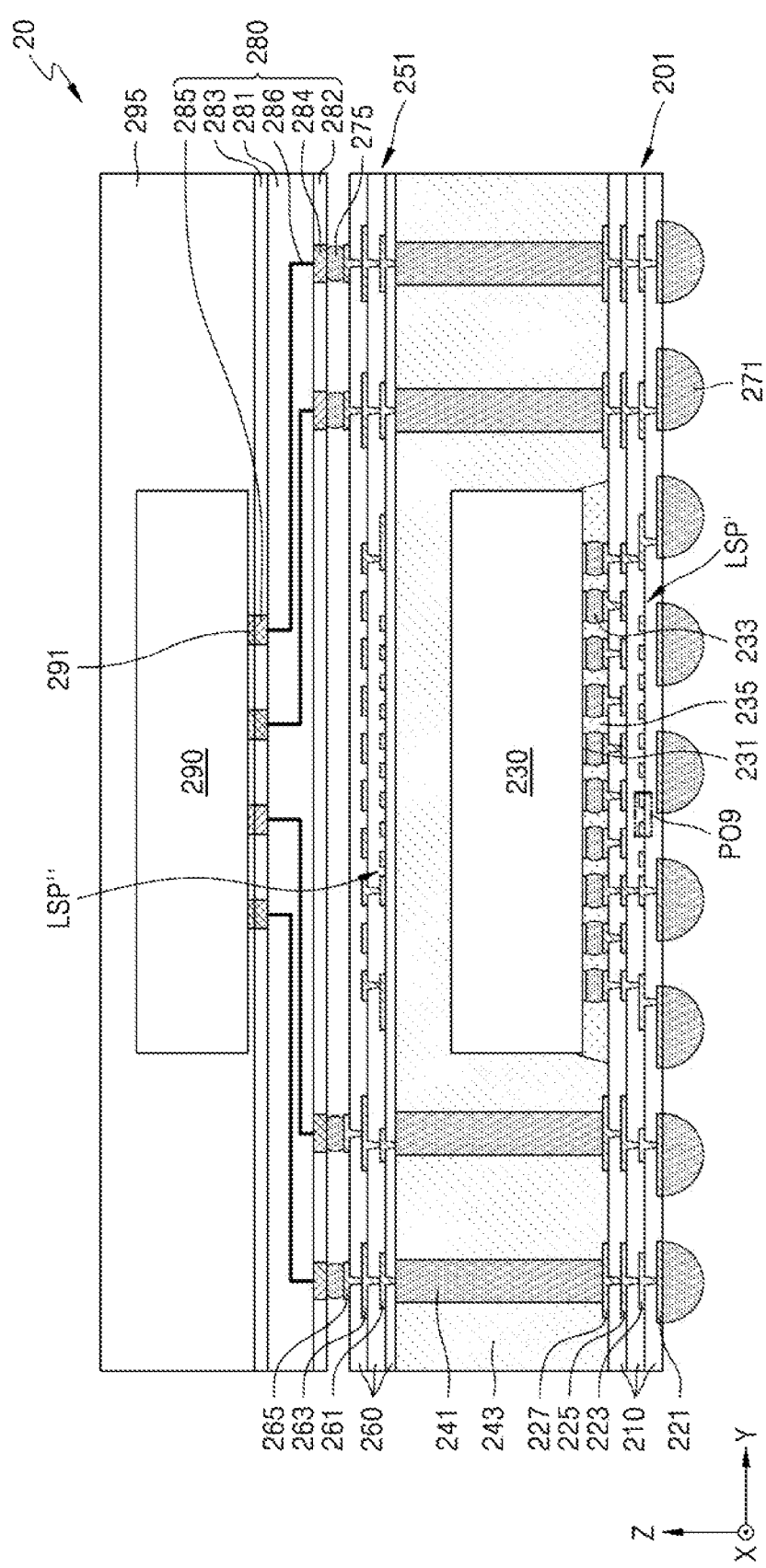
FIG. 9A is a cross-sectional view of a semiconductor package according to an example embodiment.

FIG. 9A is a cross-sectional view of a semiconductor package 20 according to an example embodiment.

Figure 9B:
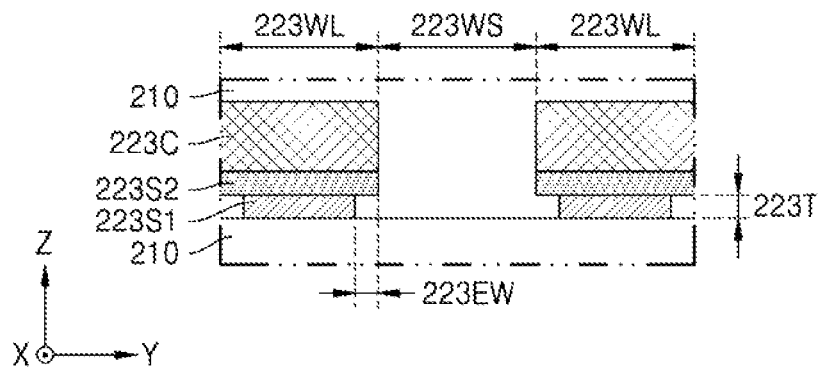
FIG. 9B is an enlarged partial cross-sectional view of a portion in FIG. 9A.

FIG. 9B is an enlarged partial cross-sectional view of portion P09 in FIG. 9A.

Referring to FIGS. 9A and 9B, the semiconductor package 20 may include a first redistribution layer 201, a first semiconductor chip 230, conductive posts 241, an insulation filler 243, a second redistribution layer 251, a package substrate 280, and a second semiconductor chip 290. The semiconductor package 20 may include a wafer level fan out package.

In an implementation, the first redistribution layer 201 may include insulation layers 210, pads 221, and redistribution patterns 223, 225, and 227. In an implementation, the first redistribution layer 201 may be provided by using a wafer level process. In an implementation, the first redistribution layer 201 may be provided by repeatedly performing the method described with reference to FIGS. 1 through 7C.

In an implementation, the insulation layers 210 may include a material described above for the insulation layer (refer to 120 in FIG. 2B). The insulation layers 210 may cover the pads 221 and the redistribution patterns 223, 225, and 227.

Connection terminals 271 including a solder material may be attached under the pads 221.

The redistribution patterns 223, 225, and 227 may include line portions extending in horizontal directions (e.g., the X direction and the Y direction), via portions extending in a vertical direction (e.g., the Z direction) and connecting the redistribution patterns 223, 225, and 227, which are apart from each other in the vertical direction, to each other, and pad portions serving as pads for the via portions and the conductive posts 241.

In an implementation, the pad portions of the redistribution patterns 227 may be connected to chip pads 231 of the first semiconductor chip 230, or to the conductive posts 241.

In an implementation, the first redistribution layer 201 may be formed by using a chip-last process, and accordingly, the via portions of the redistribution patterns 223, 225, and 227 may have a structure tapered in a downward direction (that is, a direction away from the first semiconductor chip 230).

In an implementation, the first redistribution layer 201 may be formed by using a chip-first process, and accordingly, the via portions of the redistribution patterns 223, 225 and 227 may also have a structure tapered in an upward direction (e.g., a direction toward the first semiconductor chip 230).

Some redistribution patterns 223 of the redistribution patterns 223, 225, and 227 may constitute line and space patterns LSP'. In an implementation, the redistribution patterns 223 included in the line and space patterns LSP' may extend in the X direction, and be spaced apart from each other in the Y direction. A line width 223WL and a space width 223WS of the redistribution patterns 223 included in the line and space patterns LSP' may be substantially the same as each other. In an implementation, each of the line width 223WL and the space width 223WS may be equal to or less than about 2 μm. In an implementation, each of the line width 223WL and the space width 223WS may be greater than about 2 μm. In an implementation, each of the line width 223WL and the space width 223WS may be about 15 μm.

In an implementation, each of the redistribution patterns 223 may include a first seed pattern 223S1, a second seed pattern 223S2, and a conductive pattern 223C. In an implementation, descriptions of dimensional characteristics and compositional characteristics of each of the first seed patterns 223S1 may be substantially the same as descriptions of the first seed patterns (refer to 131 in FIG. 7C). In an implementation, descriptions of dimensional characteristics and compositional characteristics of each of the second seed patterns 223S2 may be substantially the same as descriptions of the second seed patterns (refer to 141 in FIG. 7C). In an implementation, descriptions of dimensional characteristics and compositional characteristics of each of the conductive patterns 223C may be substantially the same as descriptions of the conductive patterns (refer to 150 in FIG. 7C).

In an implementation, both sidewalls of the first seed patterns 223S1, which contact the second seed patterns 223S2, may be recessed with respect to the second seed patterns 223S2 in the Y direction. In an implementation, an exclusion width 223EW, which is a recessed width on both sides of the first seed patterns 223S1, may be in a range of 0.1 to 2 times a thickness 223T of the first seed patterns 223S1 (e.g., a height in the Z direction). In an implementation, the exclusion width 223EW may be equal to or less than about 1.5 times the thickness 223T. In an implementation, the exclusion width 223EW may be equal to or less than about 1.0 times the thickness 223T.

The first semiconductor chip 230 and the conductive posts 241 may be arranged on the first redistribution layer 201. The first semiconductor chip 230 and the conductive posts 241 may be arranged between a first redistribution layer 201 and a second redistribution layer 251. The first semiconductor chip 230 may be electrically connected to the first redistribution layer 201. The conductive posts 241 may be connected to each of the first and second redistribution layers 201 and 251. The conductive posts 241 may provide an electrical connection between the first and second redistribution layers 201 and 251.

In an implementation, the first semiconductor chip 230 may include a logic chip. In an implementation, the first semiconductor chip 230 may include at least one of a central processing unit (CPU), an application processor (AP), a graphics processing unit (GPU), a neural processing unit (NPU), a tensor processing unit (TPU), a vision processing unit (VPU), an image signal processing unit (ISP), and a digital signal processor (DSP).

The first semiconductor chip 230 may be mounted on the first redistribution layer 201 in a face-down method or a flip chip method. In an implementation, a lower surface of the first semiconductor chip 230, under which the chip pads 231 are formed, may face the first redistribution layer 201. The chip pads 231 of the first semiconductor chip 230 may be electrically connected to second upper pads 118 via chip connection bumps 233. The chip pads 231 may include terminals for input/output data signal transmission of the first semiconductor chip 230, or terminals for power and/or ground of the first semiconductor chip 230.

An underfill material layer 235 covering the chip connection bumps 233 may be arranged between the first semiconductor chip 230 and the first redistribution layer 201. The underfill material layer 235 may include, e.g., an epoxy resin formed by using a capillary underfill process. In an implementation, the underfill material layer 235 may include a non-conductive film. In an implementation, the insulation filler 243 may be directly filled into a space between the first semiconductor chip 230 and the first redistribution layer 201 by using a molded underfill method, and in this case, the underfill material layer 235 may be omitted.

The insulation filler 243 may be provided on the first redistribution layer 201. The insulation filler 243 may protect the first redistribution layer 201, the first semiconductor chip 230, the conductive posts 241, and the second redistribution layer 251 from external environment. The insulation filler 243 may cover at least a portion of each of the first redistribution layer 201, the first semiconductor chip 230, the conductive posts 241, and the second redistribution layer 251. In an implementation, the insulation filler 243 may cover an upper surface of the first redistribution layer 201, side surfaces and an upper surface of the first semiconductor chip 230, side surfaces of the conductive posts 241, and a lower surface of the second redistribution layer 251.

In an implementation, the second redistribution layer 251 may include insulation layers 260 and redistribution patterns 261, 263, and 265. In an implementation, the second redistribution layer 251 may be formed by using a wafer level process. In an implementation, the second redistribution layer 251 may be provided by repeatedly performing the method described with reference to FIGS. 1 through 7C.

In an implementation, the insulation layers 260 may include a material described above for the insulation layer (refer to 120 in FIG. 2B). The insulation layers 260 may cover the redistribution patterns 261, 263, and 265.

The redistribution patterns 261, 263, and 265 may include line portions extending in the horizontal directions (e.g., the X direction and the Y direction), via portions extending in a vertical direction (e.g., the Z direction) and connecting the redistribution patterns 261, 263, and 265, which are spaced apart from each other in the vertical direction, to each other, and pad portions serving as pads for the via portions and the connection terminals 275. In an implementation, at least some via portions of the redistribution patterns 261 may be connected to the conductive posts 241.

In an implementation, each of the redistribution patterns 261, 263, and 265 may, respectively and similarly to redistribution patterns 223, 225, and 227, include the first seed pattern including a first metal material such as Ti, the second seed pattern including a second metal material such as Cu, and a conductive pattern including a second metal material. Some of the redistribution patterns 263 may constitute line and space patterns LSP". Descriptions of structural characteristics and dimensional characteristics of the redistribution patterns 263 included in the line and space patterns LSP" may be substantially the same as descriptions given for the line and space patterns LSP', and thus, repeated descriptions thereof may be omitted.

The package substrate 280 may be mounted over the second redistribution layer 251. The package substrate 280 may include, e.g., a printed circuit board. The package substrate 280 may include a substrate base 281 including at least one of phenol resin, epoxy resin, and polyimide. In an implementation, the package substrate 280 may include upper pads 285 arranged on an upper surface of the substrate base 281, and lower pads 284 arranged under a lower surface of the substrate base 281. Wirings 286 configured to be electrically connected to the upper pads 285 and the lower pads 284 may be formed in the substrate base 281. An upper protection layer 283 covering the upper surface of the substrate base 281 and exposing the upper pads 285 may be arranged on the substrate base 281. A lower protection layer 282 covering the lower surface of the substrate base 281 and exposing the lower pads 284 may be arranged under the substrate base 281.

In an implementation, the package substrate 280 may be connected to the second redistribution layer 251 via the connection terminals 275 including a solder material. The lower pads 284 of the package substrate 280 may be configured to be electrically connected to redistribution patterns 265 of the second redistribution layer 251 via the connection terminals 275.

The second semiconductor chip 290 may be mounted on the package substrate 280. The second semiconductor chip 290 may also include a semiconductor chip of the same type as the first semiconductor chip 230. In an implementation, the second semiconductor chip 290 and the first semiconductor chip 230 may include heterogeneous semiconductor chips.

The second semiconductor chip 290 may include, e.g., a volatile memory chip and/or a non-volatile memory chip. The volatile memory chip may include, e.g., dynamic random access memory (RAM) (DRAM), static RAM (SRAM), thyristor RAM (TRAM), zero capacitor RAM (ZRAM), or twin transistor RAM (TTRAM). The non-volatile memory chip may include, e.g., a flash memory, magnetic RAM (MRAM), spin-transfer-torque MRAM (STT-MRAM), ferroelectric RAM (FRAM), phase change RAM (PRAM), nanotube RRAM, polymer RAM, or an insulator resistance change memory, or the like.

Chip pads 291 may be arranged under the second semiconductor chip 290. The chip pads 291 may contact the upper pads 285 of the package substrate 280. Upper surfaces of the second semiconductor chip 290 and the package substrate 280 may be covered by an insulation filler 295.

Figure 10:
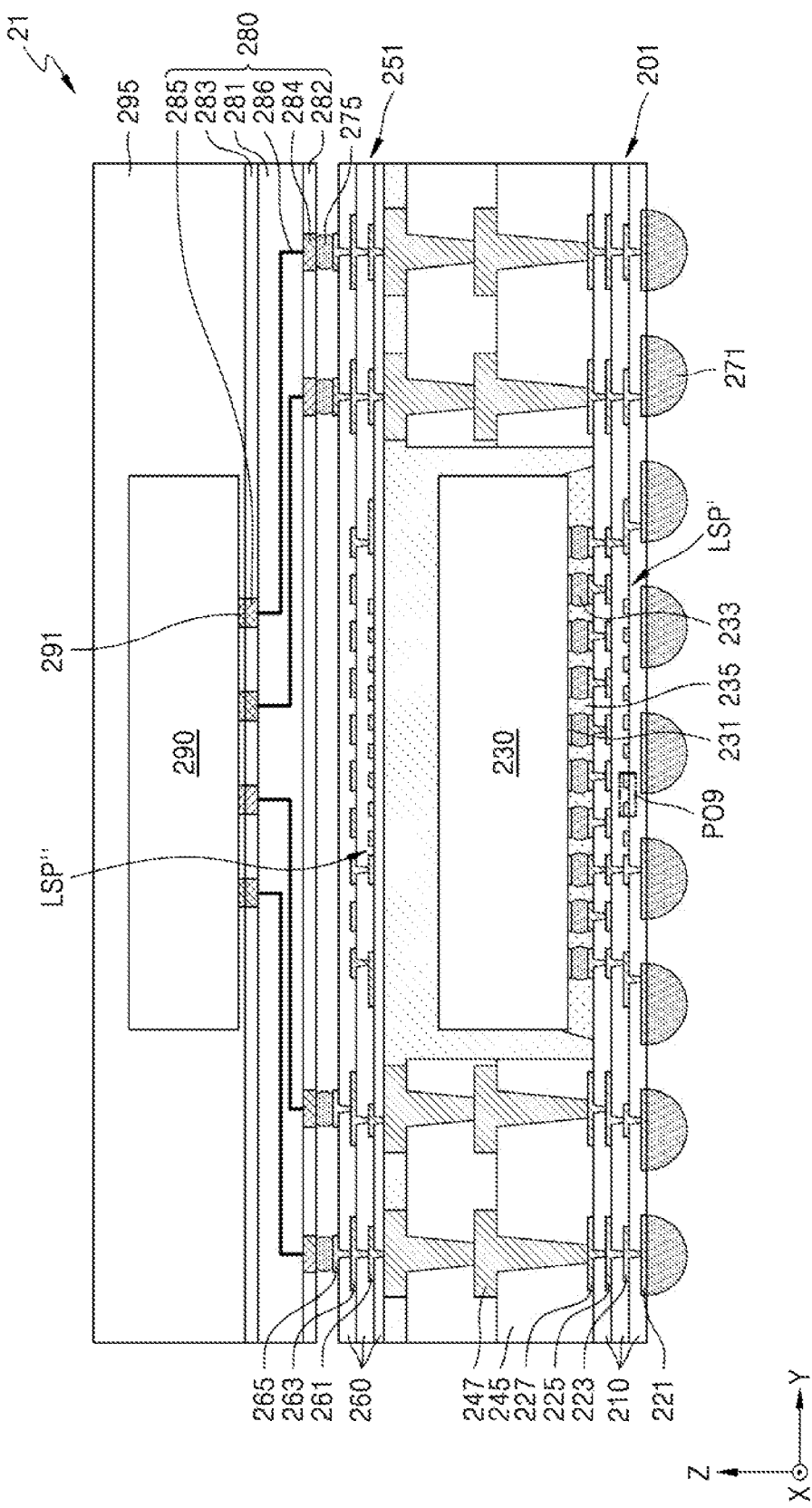
FIG. 10 is a cross-sectional view of a semiconductor package according to an example embodiment.

FIG. 10 is a cross-sectional view of a semiconductor package 21 according to another example embodiment.

Referring to FIGS. 9A, 9B, and 10, the semiconductor package 21 may include the first redistribution layer 201, the first semiconductor chip 230, the insulation filler 243, the second redistribution layer 251, the package substrate 280, and the second semiconductor chip 290. The semiconductor package 21 may include a panel level fan out package.

Descriptions of the first redistribution layer 201, the first semiconductor chip 230, the insulation filler 243, the second redistribution layer 251, the package substrate 280, and the second semiconductor chip 290 may be substantially the same as the descriptions given with reference to FIGS. 9A and 9B, and thus, repeated descriptions thereof may be omitted.

Referring to FIG. 10, the semiconductor package 21 may include insulation layers 245 and through silicon vias (TSVs) 247. The insulation layers 245 may horizontally surround the first semiconductor chip 230. The TSVs 247 may provide an electrical connection between the first and second redistribution layers 201 and 251. The TSVs 247 may be connected to the redistribution patterns 227 of the first redistribution layer 201 and the redistribution patterns 261 of the second redistribution layer 251.

By way of summation and review, miniaturized lines and space patterns may be vulnerable to short circuit defects due to bridges therebetween or open defects due to damage thereof. Methods of forming such miniaturized lines and space patterns may have enhanced reliability.

One or more embodiments may provide a method of manufacturing a semiconductor package having high reliability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

What is claimed is:

1. A method of manufacturing a semiconductor package, the method comprising:
providing a first seed layer on an insulation layer such that the first seed layer includes a first metal material;
providing a second seed layer on the first seed layer such that the second seed layer includes a second metal material that is different from the first metal material;
forming photoresist patterns on the second seed layer;
forming conductive patterns that fill spaces between the photoresist patterns, and including the second metal material, such that the conductive patterns have line shapes that extend in a first direction and are spaced apart from each other in a second direction orthogonal to the first direction;
removing the photoresist patterns;
etching the second seed layer to form second seed patterns such that the second seed patterns have line shapes extending in the first direction and are spaced apart from each other in the second direction; and
etching the first seed layer to form first seed patterns such that the first seed patterns have line shapes extending in the first direction and are spaced apart from each other in the second direction,
wherein etching the first seed layer includes etching with an etchant that includes deionized water, a fluorine compound, a competing compound, a corrosion inhibitor, and an acid different from the corrosion inhibitor.

2. The method as claimed in claim 1, wherein a pH of the etchant is in a range of 1.0 to 6.0.

3. The method as claimed in claim 1, wherein the acid is included in the etchant in an amount of 0.1 wt % to 10 wt %, based on a total weight of the etchant.

4. The method as claimed in claim 1, wherein the acid includes nitric acid.

5. The method as claimed in claim 1, wherein the fluorine compound includes $NH_4F$, $NF_4BF_4$, $N(Bu)_4F$, $N(Bu)_4BF_4$, $NH_4HF_2$, $NH_4PF_6$, or $N(Bu)_4PF_6$.

6. The method as claimed in claim 1, wherein the fluorine compound is included in the etchant in an amount of 0.5 wt % to 5 wt %, based on a total weight of the etchant.

7. The method as claimed in claim 1, wherein an amount by weight of the fluorine compound in the etchant is greater than an amount by weight of the competing compound in the etchant.

8. The method as claimed in claim 1, wherein a difference between an amount by weight of the fluorine compound in the etchant and an amount by weight of the competing compound in the etchant is in a range of 0.1 wt % to 1.0 wt %.

9. The method as claimed in claim 1, wherein the competing compound is included in the etchant in an amount of 0.1 wt % to 4.5 wt %, based on a total weight of the etchant.

10. The method as claimed in claim 1, wherein the competing compound includes a halogenide.

11. The method as claimed in claim 1, wherein, in the etching of the first seed layer, the corrosion inhibitor of the etchant prevents damage to the second seed patterns and the conductive patterns.

12. The method as claimed in claim 1, wherein the corrosion inhibitor is included in the etchant in an amount of 0.1 wt % to 2 wt %, based on a total weight of the etchant.

13. The method as claimed in claim 1, wherein the competing compound in the etchant includes CaF or AgBr.

14. A method of manufacturing a semiconductor package, the method comprising:
    providing a first seed layer on an insulation layer such that the first seed layer includes a first metal material;
    forming second seed patterns and conductive patterns on the first seed layer such that the second seed patterns include a second metal material that is different from the first metal material, the conductive patterns include the second metal material, and the second seed patterns and the conductive patterns each have line shapes that extend in a first direction and are spaced apart from each other in a second direction orthogonal to the first direction; and
    etching the first seed layer to form first seed patterns such that the first seed patterns have line shapes extending in the first direction and are spaced apart from each other in in the second direction,
    wherein:
    etching the first seed layer includes etching with an etchant that includes fluorine ions and negative ions that undergo a negative ion competing reaction against the fluorine ions,
    the etchant further includes an acid in an amount of 0.2 wt % to 10 wt %, based on a total weight of the etchant, and
    an etching rate of the first seed layer by the etchant is in a range of 200 Å/min to 2,000 Å/min.

15. The method as claimed in claim 14, wherein an application time of the etchant is greater than a time value obtained by dividing a thickness of the first seed layer by the etching rate of the etchant on the first seed layer.

16. The method as claimed in claim 14, wherein an application time of the etchant is in a range of 1 to 10 times a time value obtained by dividing a thickness of the first seed layer by the etching rate of the etchant on the first seed layer.

17. The method as claimed in claim 14, wherein an application time of the etchant is in a range of 1 to 3 times a time value obtained by dividing a thickness of the first seed layer by the etching rate of the etchant on the first seed layer.

18. The method as claimed in claim 14, wherein sidewalls of the first seed patterns are etched by the etchant such that the sidewalls of the first seed patterns are recessed in the second direction with respect to sidewalls of the second seed patterns.

19. The method as claimed in claim 18, wherein a depth to which the sidewalls of first seed patterns are recessed in the second direction with respect to sidewalls second seed patterns is in a range of 0.1 to 2 times a thickness of each of the first seed patterns in a vertical direction orthogonal to the first direction and the second direction.

20. A method of manufacturing a semiconductor package, the method comprising:
    forming a first seed layer including titanium;
    forming second seed patterns and conductive patterns on the first seed layer such that the second seed patterns and the conductive patterns each include copper and the second seed patterns and the conductive patterns each have line shapes that extend in a first direction and are apart from each other in a second direction orthogonal to the first direction; and
    etching the first seed layer to form first seed patterns such that the first seed patterns have line shapes extending in the first direction and are spaced apart from each other in the second direction,
    wherein:
    etching the first seed layer includes etching with an etchant that includes fluorine ions and negative ions undergoing a negative ion competing reaction against the fluorine ions,
    the etchant further includes a corrosion inhibitor including at least one of, thiazole, benzotriazole, imidazole, thiadiazole, another azole compound, amine, a Schiff base, or an amino acid drug compound, and
    an application time of the etchant is in a range of 1 to 10 times a time value obtained by dividing a thickness of the first seed layer by an etching rate of the etchant on the first seed layer.

* * * * *